United States Patent [19]

Selinko

[11] 4,437,718
[45] Mar. 20, 1984

[54] NON-HERMETICALLY SEALED STACKABLE CHIP CARRIER PACKAGE

[75] Inventor: George J. Selinko, Lighthouse Point, Fla.

[73] Assignee: Motorola Inc., Schaumburg, Ill.

[21] Appl. No.: 331,498

[22] Filed: Dec. 17, 1981

[51] Int. Cl.³ .............................................. H01R 9/09
[52] U.S. Cl. ............................. 339/61 M; 399/17 CF; 399/75 M; 399/143 R; 399/DIG. 3
[58] Field of Search ......... 339/17 CF, 59 M, DIG. 3, 339/17 LM, 17 M, 61 M, 75 M, 75 MP, 143 R

[56] References Cited

U.S. PATENT DOCUMENTS

| | | |
|---|---|---|
| 3,340,439 | 9/1967 | Henschen et al. ................... 317/101 |
| 3,370,203 | 2/1968 | Kravitz et al. ....................... 317/101 |
| 3,795,884 | 3/1974 | Kotaka .............................. 339/59 M |
| 3,885,173 | 5/1975 | Lee ................................... 339/17 CF |
| 3,904,934 | 9/1975 | Martin ............................. 317/101 D |
| 3,917,983 | 11/1975 | Kuronen ....................... 317/101 CM |
| 3,991,463 | 11/1976 | Squitieri et al. ......................... 29/629 |
| 3,998,512 | 12/1976 | Anhalt et al. ..................... 339/17 CF |
| 4,018,494 | 4/1977 | Scheingold et al. ............. 339/17 CF |
| 4,045,105 | 8/1977 | Lee et al. ......................... 339/17 CF |
| 4,144,648 | 3/1979 | Grovender ...................... 339/17 CF |
| 4,255,003 | 3/1981 | Berg ................................ 339/17 LM |
| 4,344,662 | 8/1982 | Dalamangas et al. ......... 339/DIG. 3 |
| 4,357,061 | 11/1982 | Crosby .......................... 339/DIG. 3 |

FOREIGN PATENT DOCUMENTS 1256332 12/1971 United Kingdom ............. 339/17 M
1571857 7/1980 United Kingdom ............. 339/17 M

OTHER PUBLICATIONS

Electronics'; Jan. 17, 1980 "4-Chip Hybrid Carrier Holdsdown System Costs" by Dan I. Amey and Jack W. Balde.

Primary Examiner—John McQuade
Assistant Examiner—Gary F. Paumen
Attorney, Agent, or Firm—F. John Motsinger; James W. Gillman

[57] ABSTRACT

An improved stackable integrated chip carrierassembly is disclosed which is especially suited for use in printed circuit board with dense configuration of components in limited areas of surface. The chip carrier assembly is mounted on an associated circuit board and allows the vertical stacking of active components in chip form, integral therein. The interconnections of the associated integrated circuit chips are accomplished without soldering which lends itself for easy disassembly when it becomes necessary to remove or replace an internal chip. The chip carrier assembly has an adaptable design allowing single or vertically stacked utilization of the module-like package. To achieve the necessary electrical isolation property, a ceramic cap is placed at the upper most position relative to the integrated module assembled package. This design has relatively few parts and allows smaller diameter wire to be used to achieve the required integrated circuit chip to package electrical bonding connections, when such is required.

5 Claims, 4 Drawing Figures

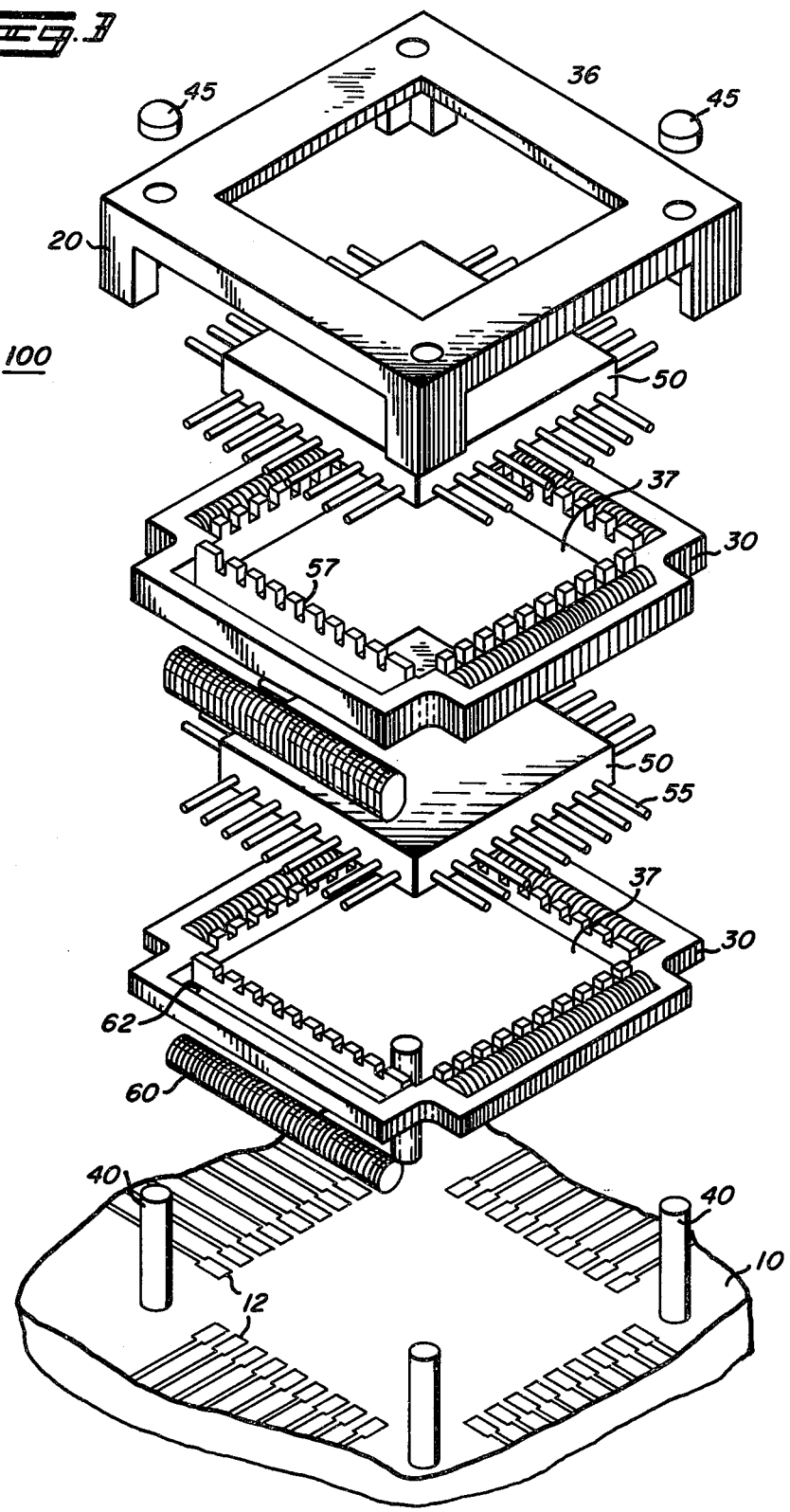

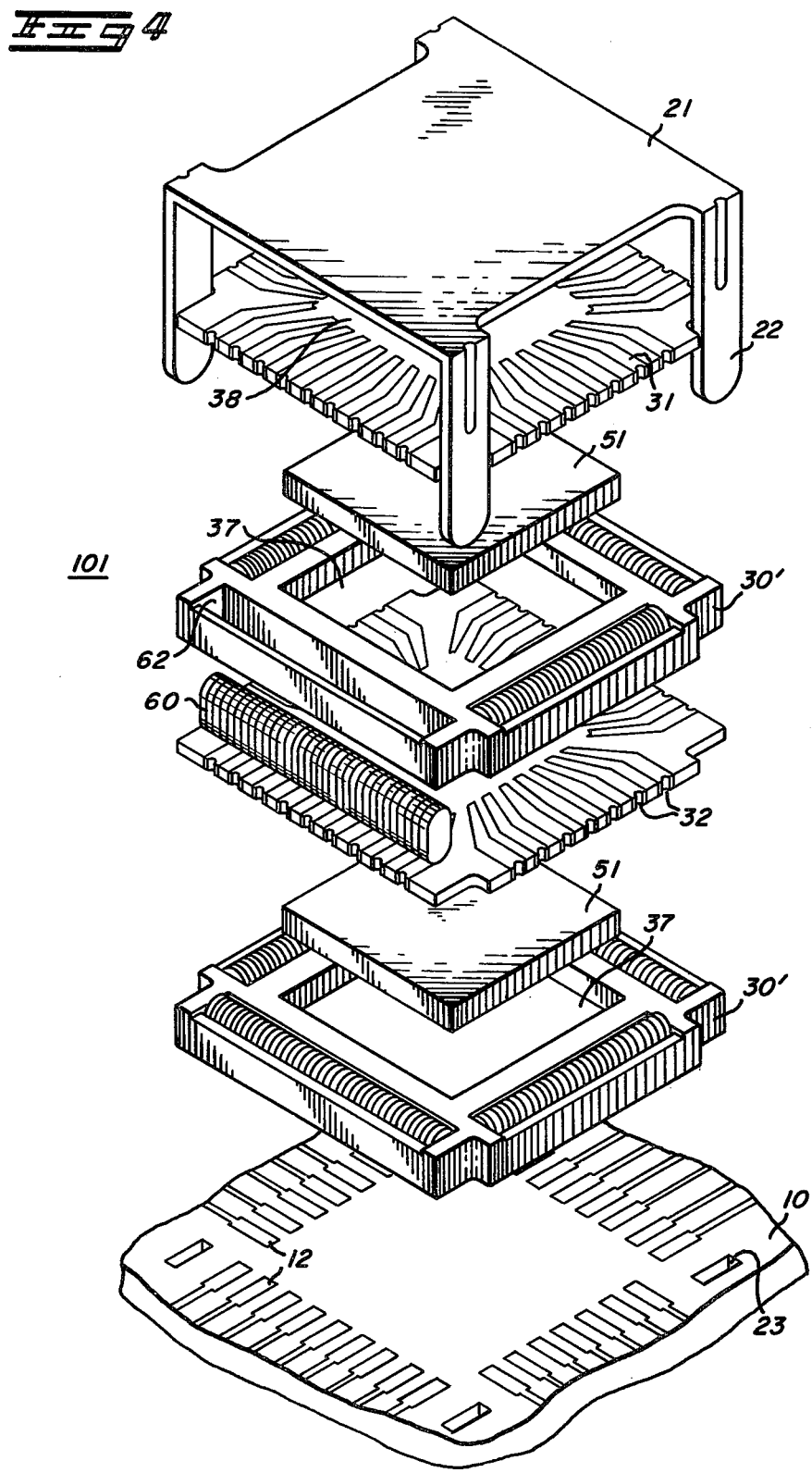

NON-HERMETICALLY SEALED STACKABLE CHIP CARRIER PACKAGE

BACKGROUND OF THE INVENTION

The present invention relates generally to flat chip carrier packages utilized for accommodating the interconnection of a plurality of electrical leads accompanying electronic active components, and in particular to a stackable flat chip carrier package which can be utilized by leadless, as well as integrated circuit devices with leads, wherein the associated electrical interconnections are accomplished without solder, enabling high volumetric efficiency to be realized by the vertical stacking of the individual integrated circuit chips within the unique design of this stackable chip carrier package.

One of the important trends in the electronics industry has been the utilization of integrated circuits as individual components due to their relatively inexpensive cost, miniaturized size, and electrical dependability. Today it is common for hundreds of complex integrated circuits to be treated as discrete components by the design engineer, with such integrated circuits being appropriately packaged and electrically connected to their associated printed circuit boards.

The challenge to the product design engineer has been to increase the number of integrated circuits utilized within the limited space requirements of the associated printed circuit board. Because of the density of the total number of electrical components required by increasingly complex designs created by the development engineer, the available space confronting the design engineer is constantly optimized during the design phase of those skilled in the art. This has led to the creative packaging of integrated circuits in such a manner as to yield greater component density for a given amount of printed circuit board space.

It has long been the case that standard approaches have resulted in the vertically stacking of electronic packages, each containing a single integrated circuit, in some manner, to obtain greater volummmetric efficiency: this has resulted in more complex interconnections and a corresponding increase in the size of the package to adequately protect and facilitate such electrical interconnections. The interconnections have to be made in such a manner to be reliable, economical, and allow the removal and replacement of a defective integrated circuit from a printed circuit board without the necessity for labor-intensive, time-consuming, soldering techniques. Furthermore, as the vertical stacking of such electronic packages have occurred, due to the close proximity of adjacent electrical circuit boards within the electronic package, it became critical to have an appropriate means to regulate the height of such stacking means, and have air circulate in the spaces between the fully operational printed circuit boards housed within the electronic product.

As the density of electrical components on a printed circuit board increases, it becomes increasingly important to maintain electrical isolation properties in the planer and vertical axis of the functional printed circuit board. The tradeoff has been to accomplish the required isolation properties, given the optimum size and available space parameters.

A common disadvantage relating to all of the foregoing known prior art devices involve the relatively high cost, and general complexity in the different quantities of unique piece-parts required, to comprise the various chip carrier packages.

Hence it has become desirable to design an improved chip carrier package, which allows facilitation of any electrical art work, has an inherent adaptable design allowing the single or multiple stack utilization of the same electrical connection, has fewer internal interconnecting parts, the use of a smaller diameter wire for bonding the integrated circuit to the chip carrier package proper, easy disassembly and removal of the integrated circuit chip for replacement or repair purposes, and the ability to accomplish what has been outlined at a lower cost than what is presently available in the prior art. The improved chip carrier package must also be sufficiently strong to withstand environmental vibrations during operation of the electronic apparatus.

SUMMARY OF THE INVENTION

It is therefore an object of this invention to provide an improved stackable chip carrier package to be used with an associated integrated circuit or a plurality of integrated circuit devices, with or without electrical leads configuration, and which will overcome the foregoing deficiencies contained in the prior art.

Another object of this invention is to provide an improved vertically stackable integrated circuit module, consisting of a plurality of standard chip carrier packages utilizing an improved adaptable design, which will allow the single and/or the vertical stacking of the same integrated circuit component, yielding an improved volumetric efficiency of available design space parameters.

Still another object of the present invention is to provide an improved vertically stackable chip carrier package, wherein fewer parts are utilized, which will result in easier disassembly and removal of the housed integrated circuit chip will be facilitated Yet another object of the present invention is to provide an improved vertically stackable chip carrier package which will accomplish the necessary electrical interconnections of housed integrated circuits, without requiring solderability of such interconnections, to each vertically stacked package, comprising the overall integrated circuit module thereof, and which will result in greater reliability of the associated integrated circuit chip interconnections therein.

In practicing the invention, an improved stackable chip carrier assembly is provided for use in electronic apparatus which will accommodate a plurality of vertically stacked integrated circuit devices and provide for a solderless electrical connection to a printed circuit board. The assembly includes a stacked array of interfitting spacer members of substantially equal size and dimension having a central cavity for accommodating a respective associated integrated circuit device therein and a plurality of elongated slots positioned around the periphery of said spacer member and extending therethrough. A plurality of elastomer conductive interconnecting bars are captivated within the elongated slots of said spacer members for effecting electrical connection in a solderless fashion between the associated integrated circuit devices and the printed circuit board. A protective enclosure overfits the spacer members for securing the same in said stacked array on the associated printed circuit board.

The improved chip carrier assembly is intended to accommodate both standard integrated circuit devices with outwardly extending leads as well as those without leads but have conductive pads positioned about a surface thereof. For leadless integrated circuit devices a secondary spacer member is further included for each such integrated circuit device which includes conductors for effecting electrical continuity between the integrated circuit device and the elastomer conductor interconnecting bars.

BRIEF DESCRIPTION OF THE DRAWINGS

The features of the present invention which are believed to be novel are set forth with particularily in the claims. The invention itself, together with further objects and advantages thereof, may be best understood by reference to the following description when taken in conjunction with the accompanying drawings, in which like reference numerals refer to like elements in the several figures, and which:

FIG. 3 is an exploded view of the stackable chip carrier assembly of figure one.

FIG. 4 is an exploded view of an alternate design of the preferred embodiment illustrating how such may be utilized with leadless integrated circuit devices utilizing conductive, double-sided substrate with custom circuitry.

DETAILED DESCRIPTION OF THE PREFERRED EMBODIMENT

Figure 1:
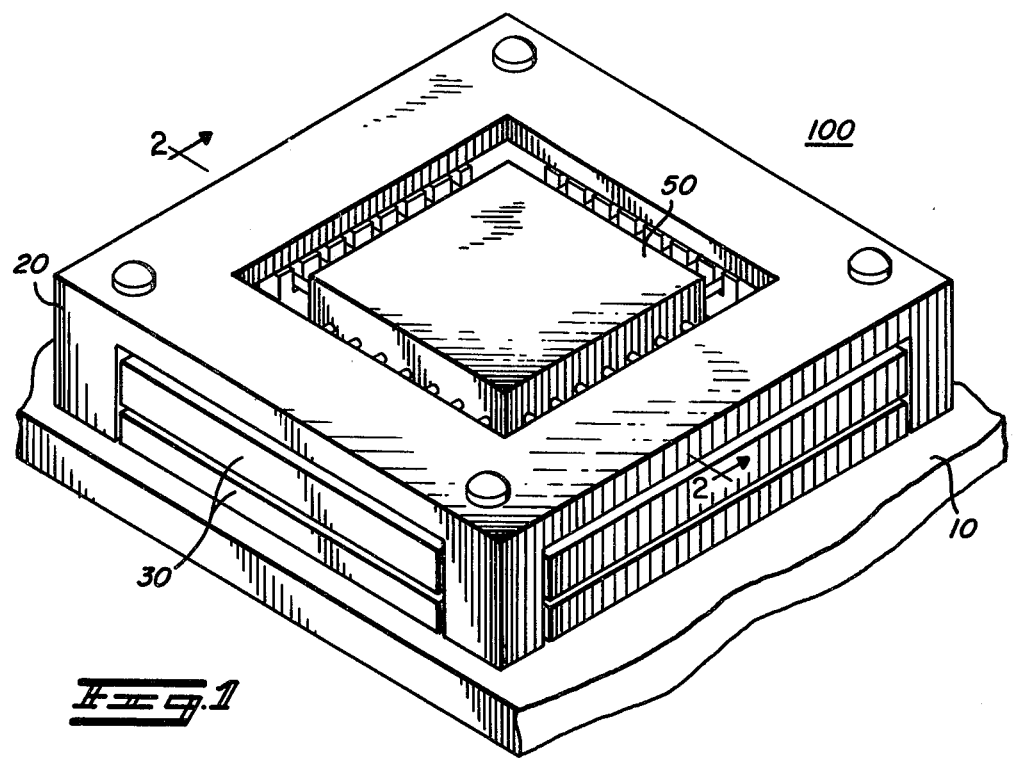
FIG. 1 is a perspective view of the stackable chip carrier package, containing two vertically stacked integrated circuits therein, inserted on a printed circuit board, said chip carrier having been constructed in accordance with the present invention.

Referring now to the drawings, FIG. 1 shows a perspective view of the stackable chip carrier package 100, together with two vertically stacked integrated circuit devices contained therein (only a single integrated circuit device 50 can be seen from this view), inserted on a printed circuit board 10, said chip carrier package having been constructed in accordance with the present invention. The improved stackable chip carrier package 100 consists of a ceramic or metallic overfitting protective outer shield 20 which fastens to the printed circuit board 10. Within this protective shield there exists a plurality of rectangular primary spacer members 30, each of which have a central cavity, into which is placed the integrated circuit device 50. A central cavity in the outer protective shield may or may not be present; it is strictly optional. The size of the improved chip carrier package depends directly upon the precise size of the particular integrated circuit devices which are intended to be housed internally.

Figure 2:
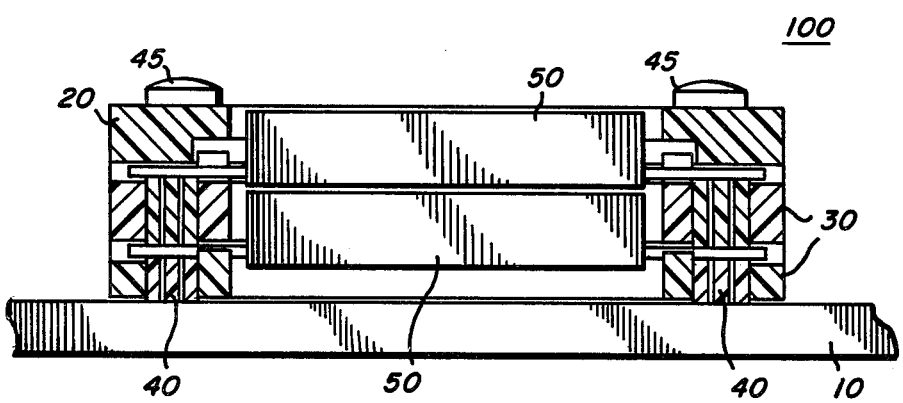
FIG. 2 is an enlarged partial sectional view of a portion of the stackable chip carrier of figure one taken essentially along lines 2—2 of figure one.

The enlarged side view of FIG. 2 is taken along lines 2—2 of FIG. 1. The improved chip carrier package 100 is fastened to a printed circuit board 10. A single rectangular primary spacer 30 is utilized with each integrated circuit device, secured by the fastened chip carrier assembly. From this view, two integrated circuit devices 50, (with leads) can easily be seen, with one stacked on top of the other, in a vertical fashion. The outer protective shield 20 fits over the assembly by snapping into place over four posts 40 (two of which can be seen from this view) protruding in an upward vertical fashion from the printed circuit board 10, with a single anchor cap 45 snugly snap-fitting over the posts which protrude slightly through the outer protective shield 20.

These anchor caps 45 may be removed for easy disassembly or replacement of any of the integrated circuit devices contained within the chip carrier package.

In FIG. 3 the entire chip carrier package 100, for use with integrated circuit devices with electrical leads, is shown in an exploded view for clarity purposes. As shown, the printed circuit board base member 10, has a plurality of protruding circular posts 40 which act as an anchor to stabilize the various elements of the chip carrier package and allow the overfitting protective shield 20 to secure itself in a snap-fit snug fashion when the chip carrier assembly is fully assembled. A plurality of anchor caps 45, secure the protective overfitting shield 20 to the circular anchor posts 40. These anchor caps 45 can be removed for easy disassembly of the chip carrier package, say for replacement of a defective integrated circuit device contained therein. As mentioned previously, when a plurality of integrated circuit devices with electrical leads are utilized, a similar number of rectangular spacer members 30, for each integrated circuit device housed, will be utilized therein. It is important to know that each of the rectangular spacer members 30 contain a central cavity 37, which is where the integrated circuit device 50 resides. Integral to each rectangular spacer member 30, there exists associated elongated slots 62, along each side thereof, which extends through said spacer member. Further, there exists within each elongated slot 62, a predetermined plurality of rectangular recesses 57, which are positioned along the length of each elongated slot, said recesses being integral to each spacer member. The predetermined plurality of rectangular recesses is equal to the number of electrical leads extending from the integrated circuit device. The integrated circuit device is placed within the central cavity 37, with its associated electrical leads resting securely in the rectangular recesses 57.

To allow interconnections without solderability, a plurality of elastomer conductive interconnecting bars 60 are captivated within each elongated slot 62 of said spacer member, which will make electrical contact with electrical leads protruding from the integrated circuit device captivated therein. There exists in the art various types of elastomer conductive interconnecting bars, such as, alternating conductive materials arranged in a horizontal plane (zebra type bars) or where the conductive material is arranged in a spiral or circular fashion (Amplifex type bars). As is illustrated, the conductive bars will contact certain predetermine electrical contact pads 12, on the face side of the printed circuit board base member 10. It should be noted, that each of the rectangular spacer member 30 are equal, in size and dimension, and with a central cavity of sufficient size to accommodate an associated integrated circuit device in a secure fashion, but will allow air to flow in between all elements of the fully assembled chip carrier package In FIG. 4, an alternate embodiment of the chip carrier package 101 is shown in an exploded view for clarity. This alternate embodiment of the invention is utilized when integrated circuit devices without leads are required in the internal environment of the electronic apparatus. Within this embodiment of the invention, a secondary rectangular spacer member 31, with plated through circuitry 32, is additionally required to align itself and make electrical contact with the internally housed integrated circuit device 51, which is leadless, and has circuit connecting pads on each of its two faces. This secondary spacer member also contains a central cavity 38. This alternative embodiment features a overfitting metallic protective shield 21, which has a plurality of downward extending fastening legs 22, which align themselves and mate with corresponding rectangular appertures 23, found in the printed circuit board 10. The fastening legs 22 are then bent over on the bottom side of the printed circuit 10, to secure the multiple elements of the chip carrier assembly, in a snug fashion. In all other aspects the alternate embodiment found in FIG. 4 follows the detailed description of FIG. 3 for the preferred embodiment.

Thus, there has been provided according to the invention, an improved, simple, inexpensive standardized stackable chip carrier assembly package which will allow the vertical stacking of integrated circuit devices, with or without electrical leads, and in a manner that does not require the soldering of electrical connections to facilitate the operation of the integrated circuit devices. Although the foregoing has been an description and illustrative of specific embodiments of the invention, various modifications and changes thereto can be made by persons skilled in the art within the scope and spirit of the invention as defined by the following claims.

What is claimed is:

1. An improved stackable chip carrier assembly for use in electronic apparatus which will accommodate a plurality of vertically stacked integrated circuit devices on and provide solderless electrical connection to a printed circuit board, including in combination:

a stacked array of interfitting spacer members of substantially equal size and dimension, each spacer member having a central cavity for accommodating a respective associated integrated circuit device therein, and a plurality of elongated slots positioned around the periphery of said spacer member and extending therethrough;

a plurality of elastomer conductive interconnecting bars captivated within said elongated slots of said spacer members for effecting electrical connection in solderless fashion directly between adjacent devices or between the associated devices and the printed circuit board:

and a protective enclosure overfitting said spacer members for securing the same in said stacked array on the associated printed circuit board.

2. An improved stackable chip carrier assembly in accordance with claim 1 wherein said spacer members have upstanding fingers around the periphery of the top surface thereof for accommodating electrical leads extending outwardly from the sides of the associated integrated circuit devices.

3. An improved stackable chip carrier assembly in accordance with claim 1 wherein means are included for accommodating leadless integrated circuit devices, said means including a secondary spacer member for each such integrated circuit device, said secondary spacer member having conductors thereon for effecting electrical continuity between the associated integrated circuit device and said elastomer conductive interconnection bars.

4. An improved stackable chip carrier assembly in accordance with claim 1 wherein said elastomer interconnecting bars include alternating segments of non-conductive and conductive elastomer materials.

5. An improved stackable chip carrier assembly in accordance with claim 1 wherein said protective enclosure is formed of a metallic conductive material for electrical isolation and shielding purposes.

* * * * *